(12) United States Patent  (10) Patent No.: US 6,980,432 B2
Natsume et al.  (45) Date of Patent: Dec. 27, 2005

(54) ELECTRONIC APPARATUS

(75) Inventors: Yoshihiro Natsume, Hamamatsu (JP);
Yutaka Toyama, Hamamatsu (JP);
Takashi Kato, Hamamatsu (JP);
Naohide Kohyama, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 58 days.

(21) Appl. No.: 10/676,325

(22) Filed: Sep. 30, 2003

(65) Prior Publication Data

US 2004/0066631 A1 Apr. 8, 2004

(30) Foreign Application Priority Data

Oct. 4, 2002 (JP) ........................................ 2002-292069

(51) Int. Cl.[7] .............................................. H05K 7/20
(52) U.S. Cl. ...................... 361/690; 361/600; 361/679; 361/736; 361/796; 361/692
(58) Field of Search ................................ 361/600, 679, 361/688–695, 728–730, 752, 796; 454/184

(56) References Cited

U.S. PATENT DOCUMENTS

| | | | | |
|---|---|---|---|---|
| 3,353,173 A | * | 11/1967 | Beilfuss | 340/286.08 |
| 4,380,947 A | * | 4/1983 | Nishimoto | 84/176 |
| 5,243,493 A | | 9/1993 | Jeng et al. | |
| 5,396,398 A | * | 3/1995 | Gill | 361/679 |
| 6,222,729 B1 | | 4/2001 | Yoshikawa | |
| 6,336,691 B1 | | 1/2002 | Maroney et al. | |
| 6,349,029 B1 | * | 2/2002 | Leman et al. | 361/683 |
| 6,501,650 B2 | * | 12/2002 | McMenamin et al. | 361/695 |
| 2001/0005309 A1 | * | 6/2001 | Iwasaki | 361/695 |

FOREIGN PATENT DOCUMENTS

| | | |
|---|---|---|
| EP | 1 170 891 A | 1/2002 |
| JP | 2000-49482 | 2/2000 |

* cited by examiner

*Primary Examiner*—Gregory Thompson
(74) *Attorney, Agent, or Firm*—Morrision & Foerster LLP

(57) ABSTRACT

There is provided an electronic apparatus that is free of the problems with the prior art and is capable of achieving higher efficiency of cooling the interior of the casing without sacrificing cost reduction and designing compact in size. A casing houses a plurality of circuit boards having electronic parts mounted thereon and at least one high load part that generates heat. The casing has exhaust ports formed therein for heat radiation and exhaust ports for heat radiation. The plurality of circuit boards are comprised of a first circuit board and a second circuit board. The first circuit board is disposed to extend substantially horizontally, and the second circuit board is disposed to extend substantially vertically with a horizontal gap provided between the first circuit board and the second circuit board. The at least one high load part is arranged below the horizontal gap, and the exhaust ports are arranged above the horizontal gap.

8 Claims, 7 Drawing Sheets

ELECTRONIC APPARATUS

BACKGROUND OF THE INVENTION

1. Field of the Invention

The present invention relates to an electronic apparatus, and more specifically, to an electronic apparatus having circuit boards and high load parts that generate heat, arranged in a casing.

2. Description of the Related Art

With recent electronic apparatuses becoming multifunctionized and more compact in size, there is a general tendency that a plurality of circuit boards, a power source, and expansion cards are packed into a casing of an electronic apparatus having a limited space. In such an electronic apparatus, hot air generated by the power source or electronic parts is blocked by, for example, a plurality of circuit boards which are closely stacked one upon another, to be confined within the casing, so that the electronic parts in the casing become excessively hot. This poses a problem that some electronic parts malfunction or become defective and hence cannot maintain their required performance.

To avoid this problem, as means for discharging heat generated in the casing to the outside of the electronic apparatus, a fan or a heat sink has been provided in the casing. However, multifunctionalization and speedup of electronic apparatuses increase the amount of heat generated in the electronic parts. This leads to increased cases where the fan or heat sink is insufficient to ventilate the interior of the casing in which the plurality of circuit boards and electronic parts are clustered. Thus, there is demand for a cooling structure for the electronic apparatus which can achieve high cooling efficiency.

For example, Japanese Laid-Open Patent Publication (Kokai) No. 2000-049482 discloses a cooling structure for electronic apparatuses which is comprised of a plurality of fans that blow uniform air flows between a plurality of circuit boards mounted in stages in the casing, and guide vanes that guide the uniform air flows.

However, with the disclosed cooling structure for electronic apparatuses, fans are provided between adjacent circuit boards, and therefore, the following problems arise: 1) The number of fans increases; 2) Costs increase; 3) The size of the casing increases; and 4) The fan themselves generate increased heat and noise.

SUMMARY OF THE INVENTION

It is an object of the present invention to provide an electronic apparatus that is free of the problems with the prior art and is capable of achieving higher efficiency of cooling the interior of the casing without sacrificing cost reduction and designing compact in size.

To attain the above object, in a first aspect of the present invention, there is provided an electronic apparatus comprising a plurality of circuit boards having electronic parts mounted thereon, at least one high load part that generates heat, and a casing that houses the plurality of circuit boards and the at least one high load part and has exhaust ports formed therein for heat radiation, wherein the electronic apparatus is disposed to extend substantially horizontally, and the plurality of circuit boards comprise a first circuit board disposed to extend substantially horizontally and a second circuit board disposed to extend substantially vertically with a horizontal gap provided between the first circuit board and the second circuit board, the at least one high load part is arranged below the horizontal gap, and the exhaust ports are arranged above the horizontal gap.

According to the first aspect of the present invention, heat generated by high load parts, arranged below the horizontal gap between the first circuit board and the second circuit board, acts to heat the air surrounding these high load parts. Consequently, upward air flows are generated, which pass through the horizontal gap. The upward air flows are discharged through the exhaust ports disposed above the gap. Thus, the heat in the casing is discharged to the outside of the casing together with the upward air flows, and therefore the circuit boards and the high load parts can be effectively cooled, to thereby improve the cooling efficiency in the casing without sacrificing cost reduction and designing compact in size.

Moreover, no fan may be provided in the casing if the heat in the casing can be efficiently discharged to the outside of the casing. Even if any fans are used, fans can be used, which consume less power than conventional fans used for ventilating the interior of the casing.

Preferably, the casing comprises a slanted top panel, a front plate, a rear plate, a pair of side plates, and a bottom plate and has a generally wedge-like shape as viewed from a side thereof.

With this arrangement, heated air can be guided to the higher end of the casing due to the generally wedge-like shape of the casing, and the guided air can be discharged through the exhaust ports. As a result, the interior of the casing can be efficiently ventilated. Such a shape of the casing can be adopted as the side shape of a mixing apparatus, the side shape of the upper part of a cathode-ray tube television set, or the like.

More preferably, at least one of the first circuit board and second circuit board has mounted thereon electronic parts constituting an audio signal modulating circuit, and the at least one high load part is a power source or an expansion card.

With this arrangement, for example, even if the electronic apparatus is a mixing apparatus in which heat tends to accumulate in the casing, the heat generated by the high load parts such as the power source and the expansion card causes the upward air flows, and therefore the circuit boards and the high load parts can be effectively cooled.

Still more preferably, the exhaust ports are formed at higher locations of the slanted top panel.

With this arrangement, the heat in the casing can be efficiently discharged to the outside of the casing together with the upward air flows.

Preferably, the plurality of circuit boards include a third circuit board, and the casing comprises a panel shaft pivoted to an end of the slanted top panel corresponding to the front plate, the slanted top panel being capable of being pivotally moved about the panel shaft, a frame for having mounted thereon the third circuit board between the pair of side plates such that the third circuit board extends substantially horizontally, and a frame shaft pivoted to one end of the frame in a vicinity of a center of each of the pair of side plates, the frame being capable of being pivotally moved about the frame shaft in a direction in which the top panel is pivotally moved.

With this arrangement, the slanted top panel can be pivotally moved about the panel shaft and the frame can be pivotally moved about the frame shaft so that maintenance can be easily carried out. Moreover, the panel shaft is pivoted to an end of the slanted top panel corresponding to the front plate, and the frame shaft is pivoted to one end of the frame in the vicinity of the center of each of the pair of side plates, to thereby provide space in the vicinity of the pivoted part of the frame shaft.

As a result, air flows are easily generated in the casing, to thereby improve the cooling efficiency in the casing.

More preferably, the electronic apparatus further comprises a fourth circuit board having operating elements mounted thereon, and the slanted top panel has formed therein a plurality of holes and slots through which the operating elements penetrate to project outward of the slanted top panel.

With this arrangement, air can be discharged through the plurality of holes and slots formed in the slanted top panel.

Still more preferably, the plurality of circuit boards include a fifth circuit board, and the frame has mounted thereon the third circuit board on which electronic parts are mounted and the fifth circuit board on which other electronic parts are mounted, and the third circuit board and the fifth circuit board are disposed such that surfaces of the third circuit board and the fifth circuit board on which no electronic parts are mounted are opposed to each other.

With this arrangement, the electronic parts mounted on the third circuit board and other electronic parts mounted on the fifth circuit board can be easily exposed to air flows passing over the respective circuit boards, whereby improved cooling effects can be obtained to enable the electronic parts to stably exhibit their functions.

Still more preferably, the electronic apparatus is a mixing apparatus for audio signals.

With this arrangement, even if the electronic apparatus is a mixing apparatus in which heat tends to accumulate in the casing, the heat generated by the high load parts such as the power source and the expansion card causes the upward air flows, and therefore the circuit boards and the high load parts can be effectively cooled.

The above and other objects, features, and advantages of the invention will become more apparent from the following detailed description taken in conjunction with the accompanying drawings.

BRIEF DESCRIPTION OF THE DRAWINGS

FIG. 6 is a side view of an electronic apparatus 100a according to a second embodiment of the present invention, showing air flows generated inside the electronic apparatus 100a.

DETAILED DESCRIPTION OF THE PREFERRED EMBODIMENTS

The present invention will now be described below in detail with reference to the drawings showing preferred embodiments thereof.

Figure 1:
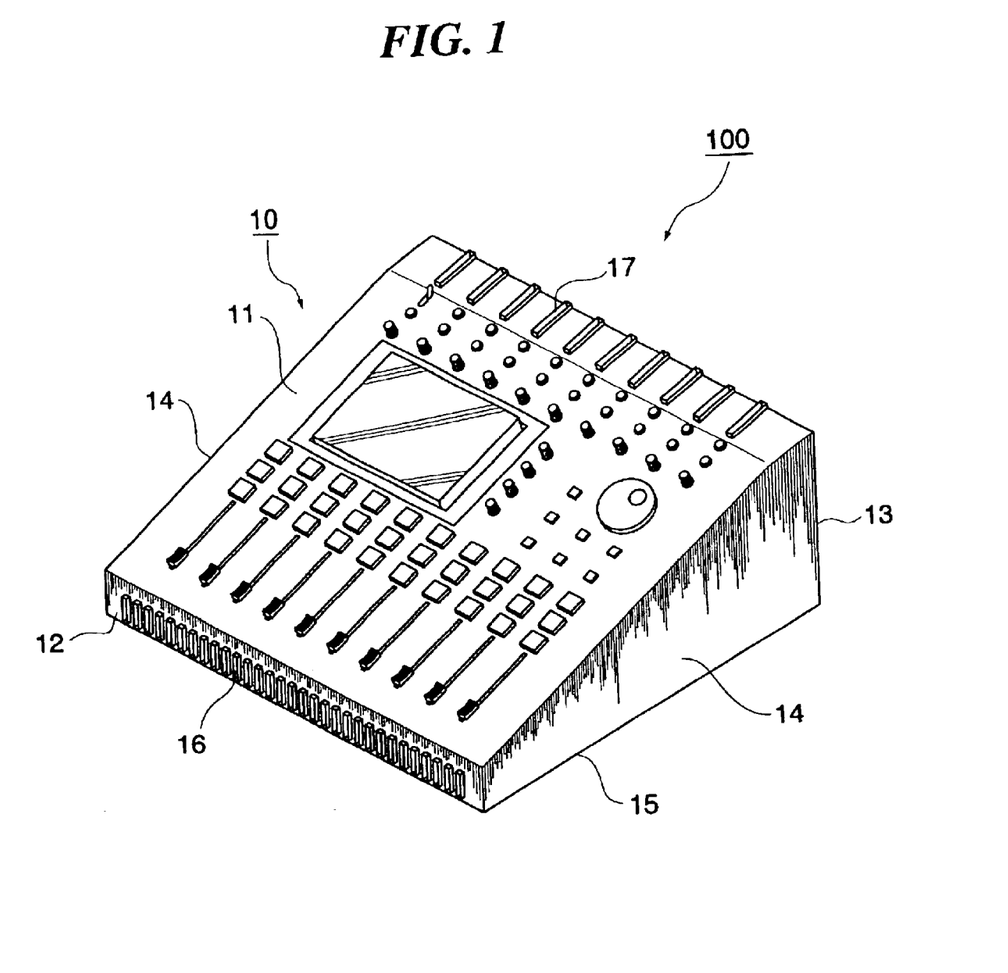
FIG. 1 is a perspective view showing the appearance of an electronic apparatus 100 according to a first embodiment of the present invention.
Figure 2:
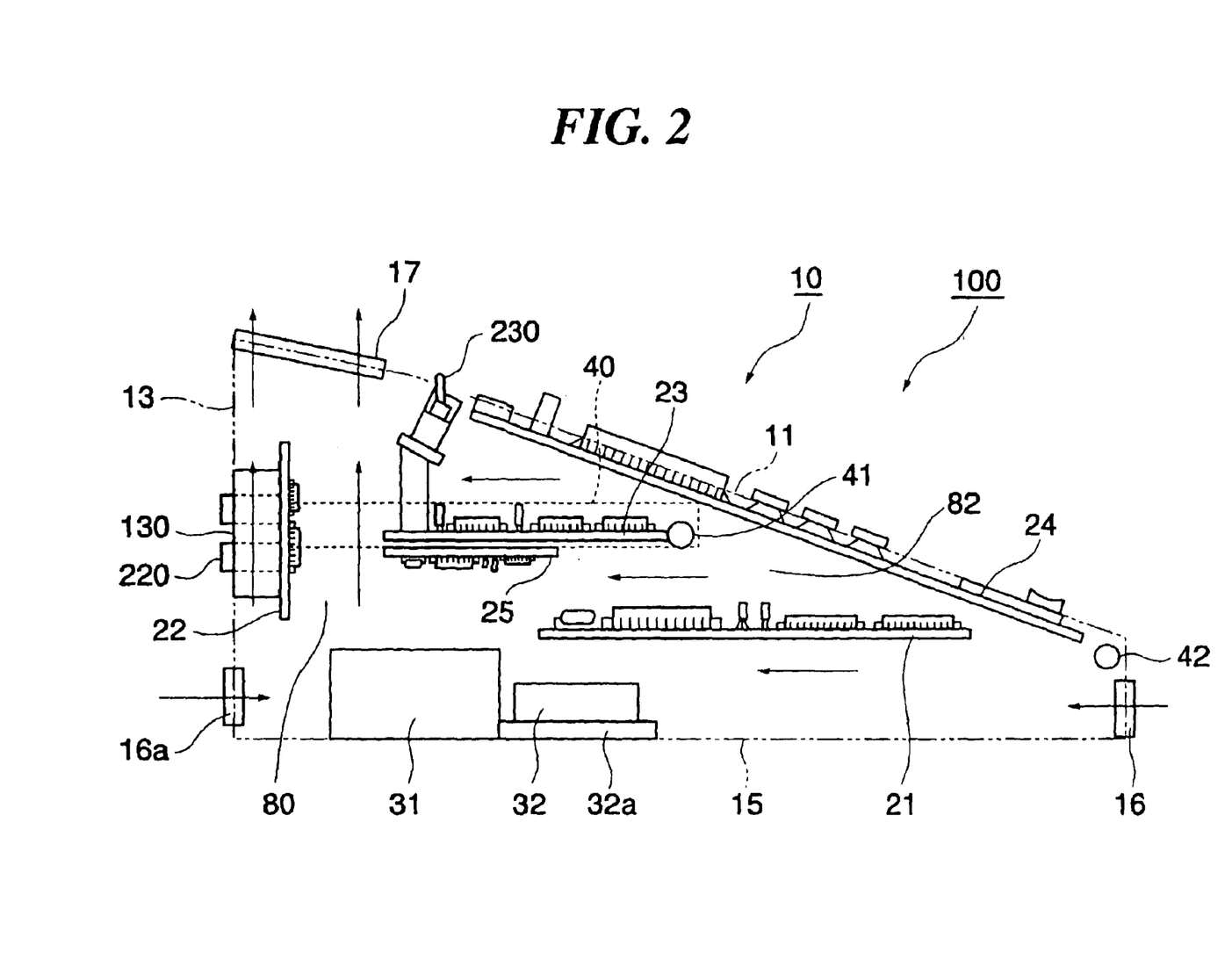
FIG. 2 is a side view of the electronic apparatus 100, showing air flows generated inside the electronic apparatus 100 shown in FIG. 1.

FIG. 1 is a perspective view showing the appearance of an electronic apparatus 100 according to a first embodiment of the present invention. FIG. 2 is a side view of the electronic apparatus 100, schematically showing air flows generated inside the electronic apparatus 100 shown in FIG. 1.

As shown in FIGS. 1 and 2, a casing 10 of the electronic apparatus 100 according to the present invention is comprised of a top panel 11, a front plate 12, a rear plate 13, a pair of side plates 14, and a bottom plate 15. The casing 10 has a generally wedge-like shape as viewed from a side thereof.

The top panel 11 is formed therein with a plurality of holes and slots through which operating elements such as faders, knobs, push buttons, and a display panel penetrate and project outward of the top panel 11. To facilitate operations of the operating elements, the top panel 11 is slanted such that the rear plate 13 is higher in level than the front panel 12. Exhaust ports 17 are formed in a rear end of the top panel 11. Further, intake ports 16 are formed in the front panel 12, and intake ports 16a are formed in a lower part of the rear plate 13.

The electronic apparatus 100 according to the present embodiment is implemented as a mixing apparatus for audio signals. The casing 10 of the electronic apparatus 100 houses a first circuit board 21, a second circuit board 22, a third circuit board 23, and a fourth circuit board 24, on which electronic parts constituting audio signal modulating circuits or the like are mounted, as well as a power source 31 and an expansion card 32 as high load parts that generate heat. The expansion card 32 is inserted into an expansion slot 32a. A program stored in a ROM in the expansion card 32 is transmitted to a predetermined circuit board via the expansion slot 32a.

The first circuit board 21 and the third circuit board 23 are disposed to extend substantially horizontally. The second circuit 22 is disposed to extend substantially vertically at a location between the first circuit board 21 and the third circuit board 23 with a horizontal gap 80 provided from the third circuit board 23 and the first circuit board 21, respectively. The fourth circuit board 24 is mounted on a back surface (inner surface) of the top panel 11 such that operating elements mounted on the fourth circuit board 24 penetrate through the holes and slots formed in the top panel 11 and project outward of the top panel 11. A fifth circuit board 25 is mounted on a back surface of the third circuit board 23 such that their back surfaces (i.e. the surfaces on which no electronic parts are mounted) are opposed to each other. Thus, the electronic parts mounted on the fifth circuit board 25 and third circuit board 23 can be easily exposed to air flows passing over the respective circuit boards, whereby improved cooling effects can be obtained to enable the electronic parts to stably exhibit their functions. The power source 31 and the expansion card 32 are arranged on the bottom plate 15 at a location below the horizontal gap 80.

The first circuit board 21 is fixed to the side plates 14 and bottom plate 15, the third circuit board 23 and the fifth circuit board 25 to the side plates 14 via a frame 40, and the fourth circuit board 24 to the top panel 11, by respective fixing means, not shown.

Figure 3:
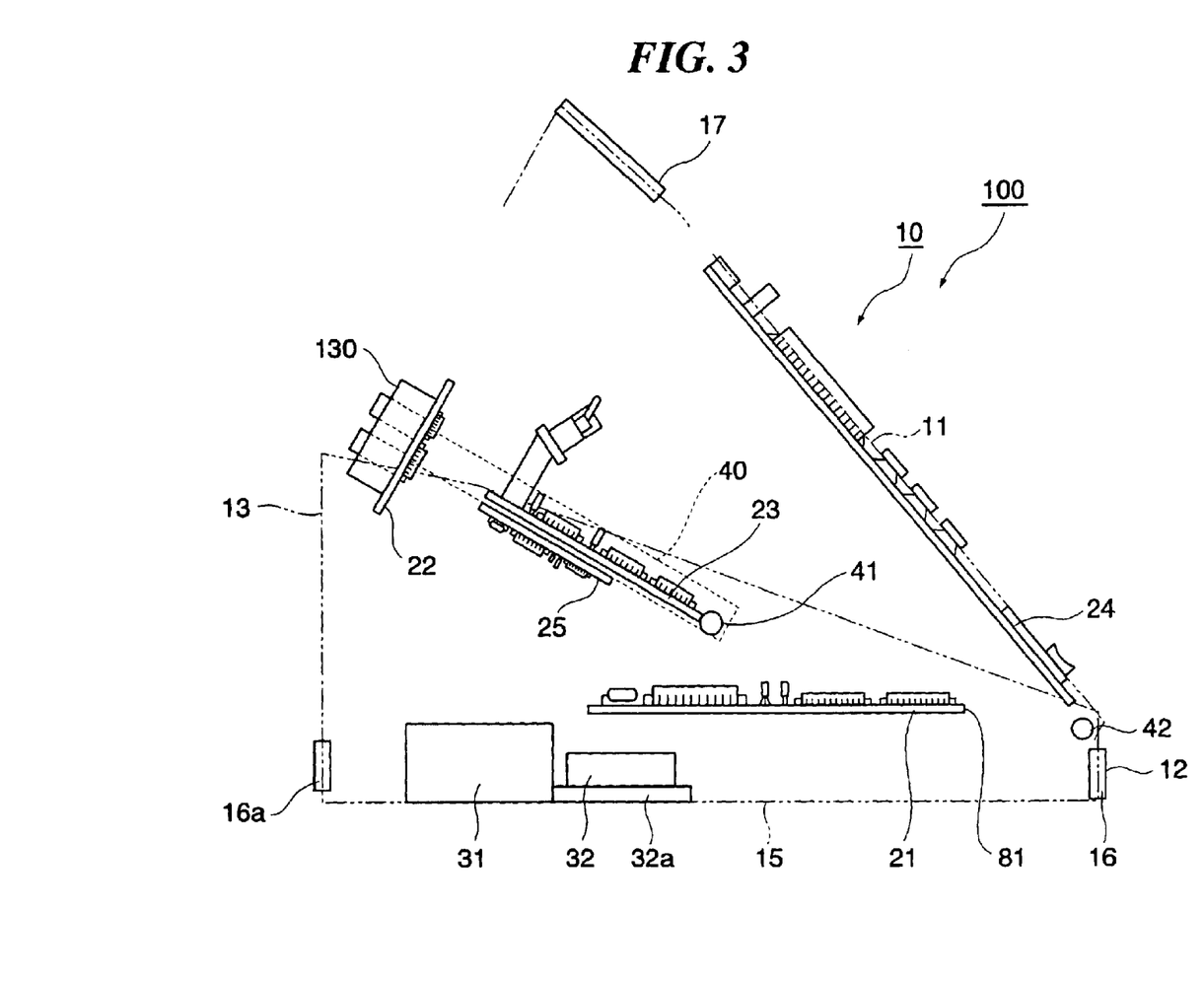
FIG. 3 is a side view of the electronic apparatus 100, shown in FIG. 1, schematically showing a top panel 11 and a frame 40 which have been pivotally moved to a position for maintenance.

FIG. 3 is a side view of the electronic apparatus 100, shown in FIG. 1, schematically showing the top panel 11 and the frame 40 which have been pivotally moved to a position for maintenance.

A panel shaft 42 is pivoted to an end of the top panel 11 on the front panel 12 side, about which the top panel 11 is pivotally moved to be opened and closed. A frame shaft 41, about which the frame 40 is vertically pivotally moved, is pivoted to a front end of the frame 40 corresponding to a front end of the third circuit board 23 at a longitudinally intermediate location in the casing 10 (in the vicinity of a longitudinal center of each of the side plates 14).

As shown in FIG. 3, the top panel 11 can be pivotally moved about the panel shaft 42 and the frame 40 can be pivotally moved about the frame shaft 41 so that maintenance can be easily carried out. The frame 40 constitutes a rear panel 130 as a part of the rear plate 13. The second circuit board 22 is mounted on an inner surface of the rear panel 130.

Figure 4:
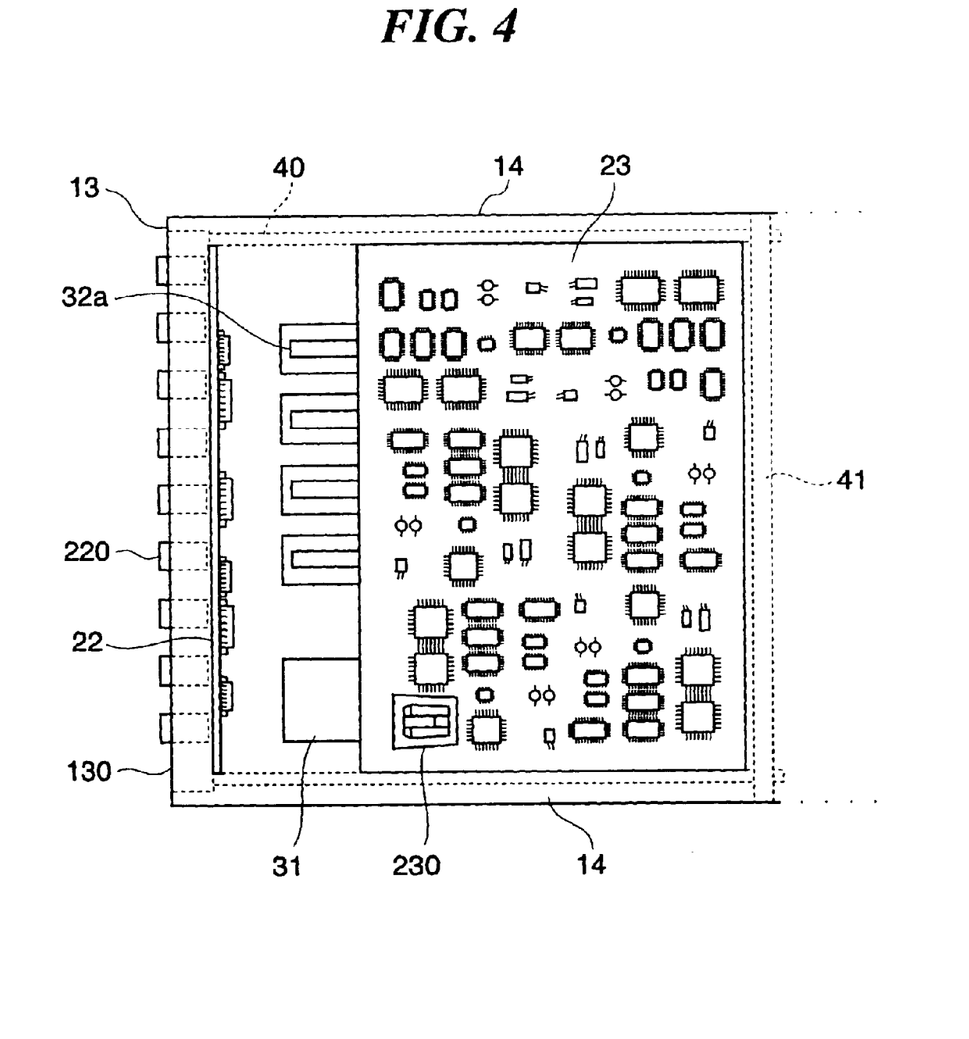
FIG. 4 is a plan view showing the arrangement of component parts inside the electronic apparatus, in which a second circuit board 22 and a third circuit board 23 are mounted on the frame 40.
Figure 5:
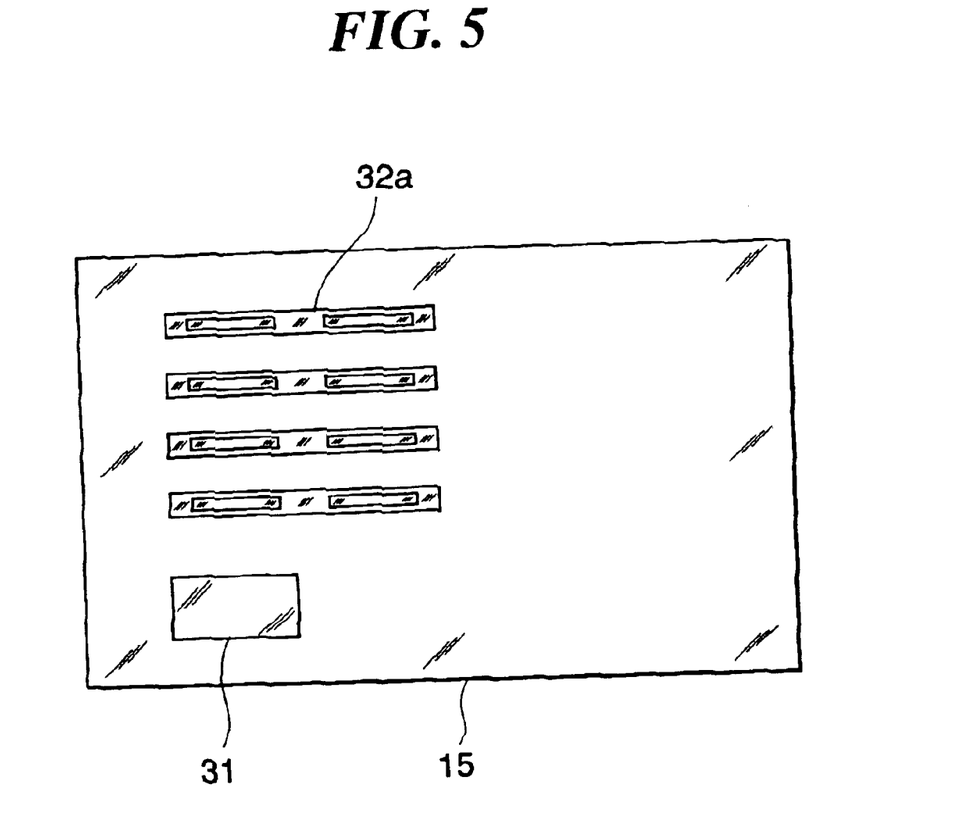
FIG. 5 is a plan view showing the arrangement of a power source 31 and expansion slots 32a on a bottom plate 15.

FIG. 4 is a plan view showing the arrangement of component parts inside the electronic apparatus, in which the second circuit board 22 and the third circuit board 23 are mounted on the frame 40. FIG. 5 is a plan view showing the arrangement of the power source 31 and the expansion slots 32a on the bottom plate 15.

As shown in FIG. 4, the second circuit board 22 is provided with a plurality of input and output terminals 220 to which external audio apparatuses and electronic musical instruments are connected. The input and output terminals 220 are arranged at intervals in the horizontal direction and are connected to the second circuit board 22. Alternatively to or in addition to the plurality of input and output terminals 220, the third circuit board 22 may be provided with a plurality of switches or the like.

The opposite sides of the third circuit board 23 which are opposed to the pair of side plates 14 are fixed to the frame 40. Further, input and output elements 230 such as switches are provided on the third circuit board 23, which penetrate through openings formed in the top panel 11 and project outward of the top panel 11.

With the above arrangement of the electronic apparatus 100 of the present embodiment, heat generated by the power source 31 and expansion card 32 as high load parts, arranged below the horizontal gap 80, acts to heat the air surrounding these high load parts. Consequently, upward air flows are generated, which pass through the horizontal gap 80. The upward air flows are discharged through the exhaust ports 17 disposed above the gap 80.

This causes spontaneous generation of air flows entering the intake ports 16 and 16a, then passing between the circuit boards 21 to 24, between the circuit boards 21 to 24 and the casing 10, and through the horizontal gap 80, and finally reaching the exhaust ports 17. As a result, the interior of the casing 10 can be efficiently ventilated to effectively cool the circuit boards 21 to 24, the power source 31, and the expansion card 32. It should be noted that the arrangement of the circuit boards 21 to 24, the power source 31, and other component parts, as well as the manners of fixing or mounting them, may be freely set insofar as the above effects can be produced.

Furthermore, with the arrangement according to the present embodiment, air flows are generated, which pass between the plurality of input and output terminals 220 arranged at intervals, through a space 82 (FIG. 2) located between the front plate 12 and the frame shaft 41 of the third circuit board 23, and through gaps between the inner peripheries of the plurality of holes and slots in the top panel 11 and the outer peripheries of the input and output members 230, to further enhance the effects of cooling of the interior of the casing.

To further improve the ventilation efficiency, with the arrangement according to the present embodiment, vertical air flows which are substantially straight in the vertical direction, extending from the power source 31 and expansion card 32, which act as heat sources, through the horizontal gap 80 to the exhaust ports 17 are formed. Further, electronic parts such as ICs, which generate much heat, are arranged on the second circuit board 22 so that heat generated by these parts can be discharged directly through the vertical air flows. Furthermore, air heated while flowing along the first circuit board 21 and the third circuit board 23 is joined to the vertical air flows.

Thus, according to the electronic apparatus of the present embodiment, the interior of the casing 10 can be cooled even without using any fans as provided in the conventional electronic apparatus. This makes it possible to reduce the cost and space in the casing required to install fans and eliminate electric noise caused by fans or other noise.

The intake ports 16 and 16a and the exhaust ports 17 may be formed at locations different from those described above; they may be formed in the side plates 14. However, the intake ports 16 and 16a should desirably be formed in a lower part of the casing 10, as shown in FIG. 2. This enables the creation of air flows upwardly extending from the lower part of the casing 10 to an upper part thereof, which are induced by the above described upward air flows. Particularly, according to the arrangement shown in FIG. 2, the intake ports 16 and 16a are arranged such that air introduced through the intake ports 16 and 16a causes air flows that come into contact with the high load parts. Consequently, the high load parts do not only discharge their own heat through the upward air flows but are also brought into contact with the air flows flowing in through the intake ports 16 and 16a, so that the high load parts are cooled by outside air.

If the casing is designed such that appropriate gas are formed in the casing when assembled and/or component parts having openings through which outside air can flow in are used, a sufficient amount of air can flow in through the gaps and/or the openings, then the intake ports 16 and 16a can be omitted. For exhaust, air can be exhausted not only through the exhaust ports 17 but also through the plurality of holes in the top panel 11, through which the operating portions are projected.

Further, since the exhaust ports 17 are formed at the rear panel 13 side end of the top panel 11, i.e. at higher positions in the casing 10, the heat in the casing can be efficiently discharged to the outside of the casing 10 together with the upward air flows.

Figure 6:
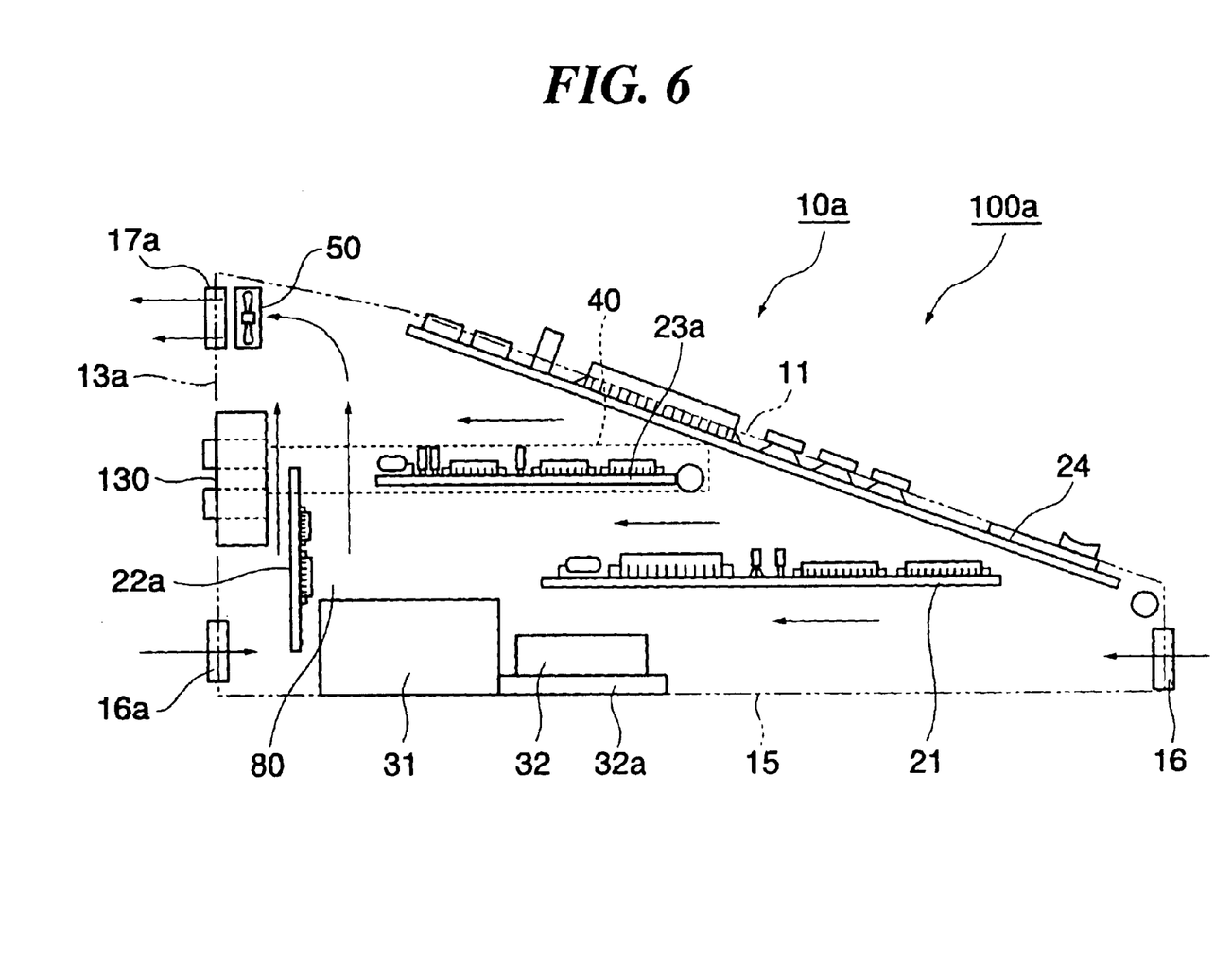

Next, a second embodiment of the present invention will be described with reference to FIG. 6. FIG. 6 is a side view of an electronic apparatus 100a according to a second embodiment of the present invention, showing air flows generated inside the electronic apparatus 100a.

The electronic apparatus 100a according to the second embodiment is distinguished from the electronic apparatus 100 of the first embodiment mainly in that a fan 50 is used and a second circuit board 22a is separated from the frame 40.

In the electronic apparatus 100a according to the present embodiment, a casing 10a has exhaust ports 17a in its rear plate 13a, and the fan 50 is provided in the casing 10a. Further, in the present embodiment, the second circuit board 22a is separated from the frame 40 and fixed to the side plates 14 of the casing 10a. Except for these, the arrangement of the present embodiment is almost the same as that of the above described first embodiment.

Also in the present embodiment, heat generated by the power source 31 and expansion card 32 acts to heat the air surrounding the power source 31 and expansion card 32 to generate upward air flows passing through the horizontal gap 80. The upward air flows are discharged through the exhaust ports 17a arranged above the gap 80. Further, in the present embodiment, the fan 50 creates negative pressure in a region of the interior of the casing 10a which corresponds to an upper part of the upper panel 11. This stabilizes the upward air flows.

With the arrangement of the second embodiment, air flows are generated, which enter the intake ports 16 and 16a, then pass between the circuit boards 21 and 22a and 24 and a circuit board 23a, between each of the circuit boards 21, 22a, 23a, and 24 and the casing 10, and through the horizontal gap 80, and finally are discharged through the exhaust ports 17a. Consequently, the interior of the casing 10a can be efficiently ventilated to effectively cool the circuit boards 21, 22a, 23a, and 24, the power source 31, and the expansion card 32.

As the fan 50, a fan providing output power that can just supplement a spontaneously generated upward air flows may be used. Therefore, the fan 50 may consume less power than conventional fans. Thus, noise can be suppressed to a lower value than the conventional arrangement using fans.

Figure 7:
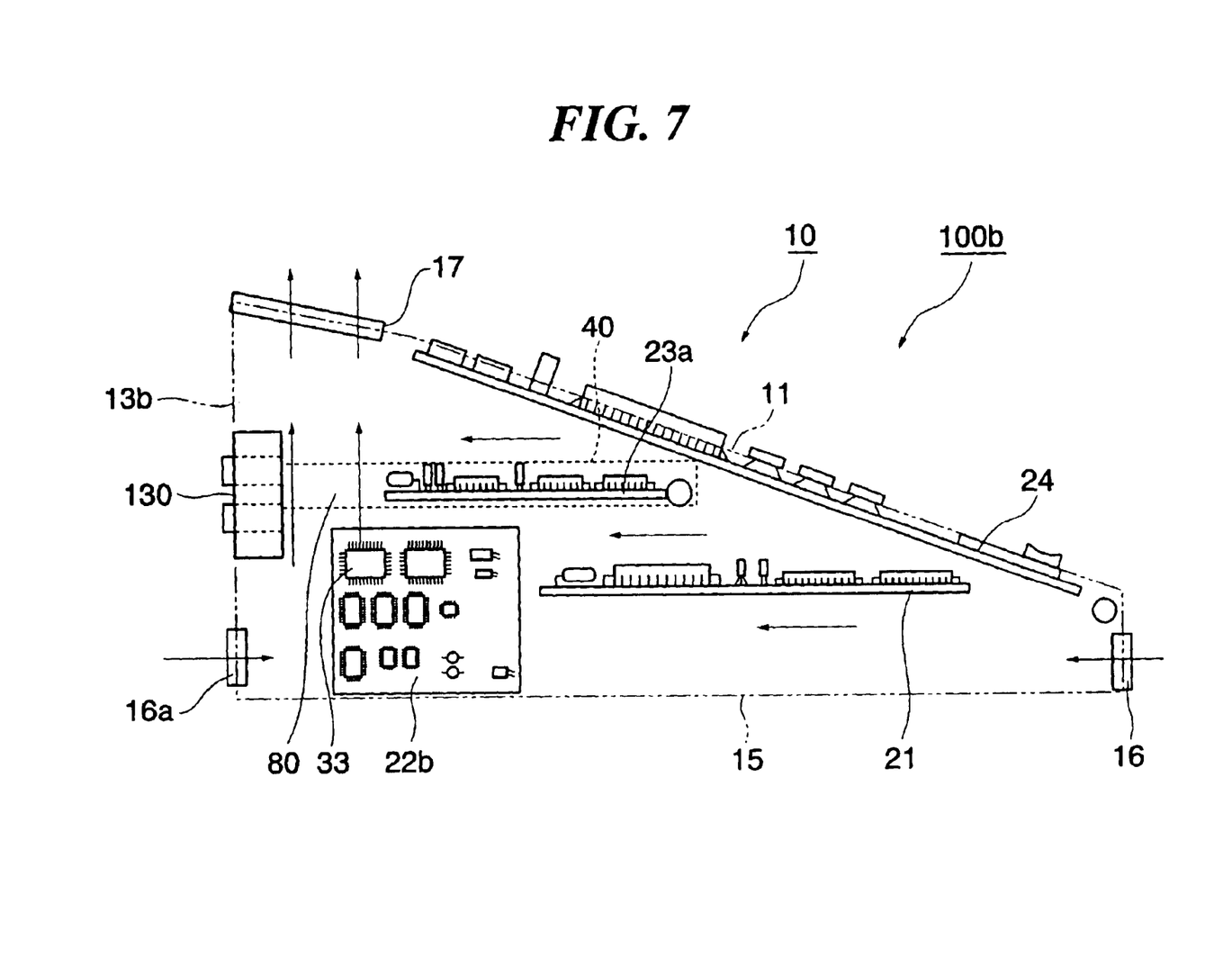
FIG. 7 is a side view of an electronic apparatus 100b according to a third embodiment of the present invention, showing air flows generated inside the electronic apparatus 100b.

Next, a third embodiment of the present invention will be described with reference to FIG. 7. FIG. 7 is a side view of an electronic apparatus 100b according to the third embodiment showing air flows generated inside the electronic apparatus 100b.

The electronic apparatus 100b according to the third embodiment is distinguished from the electronic apparatus 100a according to the second embodiment in that a second circuit board 22b is disposed to extend substantially parallel with the side plates 14.

The present embodiment is intended to solve the problem that heat is generated by ICs and the like mounted on the circuit boards instead of the power source 31 and expansion card 32, described above. Except for this, the electronic apparatus 100b is identical in construction with the electronic apparatus 100a shown in FIG. 5.

In the present embodiment, ICs 33 as high load parts are mounted on the second circuit board 22b. As is the case with the above described embodiments, the first circuit board 21 and the third circuit board 23a are disposed to extend substantially horizontally.

The second circuit 22 is disposed to extend substantially vertically between the first circuit board 21 and the third circuit board 23a with the horizontal gap 80 provided between the second circuit 22 and the third circuit board 23a. However, in the present embodiment, the second circuit board 22b is disposed to extend substantially parallel with the side plates 14.

With the above arrangement of the electronic apparatus 100b, heat generated by the ICs 33 on the second circuit board 22b acts to heat the air surrounding the ICs 33. Consequently, upward air flows are generated, which pass through the horizontal gap 80. Then, the upward air flows are discharged through the exhaust ports 17 arranged above the gap 80. This causes generation of air flows entering the intake ports 16 and 16a, then passing between the circuit boards 21 and 22b and 23a and 24, between each of the circuit boards 21, 22b, 23a, and 24 and the casing 10, and through the horizontal gap 80, and finally being discharged through the exhaust ports 17a. Consequently, the interior of the casing 10a can be efficiently ventilated to effectively cool the circuit boards 21, 22b, 23a, and 24, the power source 31, and the expansion card 32.

Further, since the second circuit board 22b is disposed to extend substantially parallel with the side plates 14, the second circuit board 22b or one or more other circuit boards, not shown, which are parallel with the second circuit board 22b, can be cooled without blocking air flows flowing in through the intake ports 16 and passing under the first circuit board 21.

In the above described embodiments, a mixing apparatus for audio signals is illustrated as the electronic apparatus. However, similar effects can be produced by applying the present invention to other electronic apparatuses such as a personal computer and audio visual equipment.

What is claimed is:

1. An electronic apparatus comprising:
   a plurality of circuit boards having electronic parts mounted thereon;
   at least one high load part that generates heat; and
   a casing that houses said plurality of circuit boards and said at least one high load part and has exhaust ports formed therein for heat radiation;
   wherein:
   the electronic apparatus is disposed to extend substantially horizontally, and said plurality of circuit boards comprise a first circuit board disposed to extend substantially horizontally and a second circuit board disposed to extend substantially vertically with a horizontal gap provided between the first circuit board and the second circuit board;
   said at least one high load part is arranged below the horizontal gap; and
   said exhaust ports are arranged above the horizontal gap.

2. An electronic apparatus according to claim 1, wherein said casing comprises a slanted top panel, a front plate, a rear plate, a pair of side plates, and a bottom plate and has a generally wedge-like shape as viewed from a side thereof.

3. An electronic apparatus according to claim 1, wherein at least one of said first circuit board and second circuit board has mounted thereon electronic parts constituting an audio signal modulating circuit, and said at least one high load part is a power source or an expansion card.

4. An electronic apparatus according to claim 2, wherein said exhaust ports are formed at higher locations of said slanted top panel.

5. An electronic apparatus according to claim 2, wherein said plurality of circuit boards include a third circuit board; and
wherein said casing comprises:
   a panel shaft pivoted to an end of said slanted top panel corresponding to said front plate, said slanted top panel being capable of being pivotally moved about said panel shaft;
   a frame for having mounted thereon said third circuit board between the pair of side plates such that the third circuit board extends substantially horizontally; and
   a frame shaft pivoted to one end of said frame in a vicinity of a center of each of said pair of side plates, said frame being capable of being pivotally moved about said frame shaft in a direction in which said top panel is pivotally moved.

6. An electronic apparatus according to claim 2, further comprising a fourth circuit board having operating elements mounted thereon, and wherein said slanted top panel has formed therein a plurality of holes and slots through which the operating elements penetrate to project outward of said slanted top panel.

7. An electronic apparatus according to claim 5, wherein said plurality of circuit boards include a fifth circuit board, and wherein said frame has mounted thereon said third circuit board on which electronic parts are mounted and said fifth circuit board on which other electronic parts are mounted, and said third circuit board and said fifth circuit board are disposed such that surfaces of said third circuit board and said fifth circuit board on which no electronic parts are mounted are opposed to each other.

8. An electronic apparatus according to claim 1, wherein said electronic apparatus is a mixing apparatus for audio signals.

* * * * *